US005882572A

United States Patent [19]
Lutze et al.

[11] Patent Number: 5,882,572
[45] Date of Patent: Mar. 16, 1999

[54] METHOD FOR PRODUCING A LINE-SHAPED WEAKENING BY MEANS OF LASERS

[75] Inventors: Walter Lutze, Jena; Ralf Schwarze, Lüneburg; Frank Schmieder, Bürgel; Wolfgang Schmidt, Soest; Rainer Schulze, Jena, all of Germany

[73] Assignee: Jenoptik Aktiengesellschaft, Jena, Germany

[21] Appl. No.: 924,993

[22] Filed: Sep. 5, 1997

[30] Foreign Application Priority Data

Sep. 7, 1996 [DE] Germany ................. 196 36 429.9

[51] Int. Cl.⁶ ...................................... B23K 26/00
[52] U.S. Cl. ............... 264/400; 219/121.71; 219/121.76; 264/409; 264/482; 264/156
[58] Field of Search ................... 264/400, 482, 264/408, 409, 155, 156; 219/121.7, 121.71, 121.76

[56] References Cited

U.S. PATENT DOCUMENTS 3,790,744  2/1974  Bowen ................... 264/482
4,549,063  10/1985  Ang et al. .
4,789,770  12/1988  Kasner et al. .
5,101,090  3/1992  Coyle, Jr. et al. .
5,632,914  5/1997  Hagenow et al. .

FOREIGN PATENT DOCUMENTS 0 234 805  4/1990  European Pat. Off. .
0 711 627  5/1996  European Pat. Off. .
195 46 585  6/1997  Germany .
WO 90/07398  7/1990  WIPO .

OTHER PUBLICATIONS

Patent Abstracts of Japan, Publication No. 02099324, Publ. Date Apr. 11, 1990, "Preparation of Interior Part Having Air Bag Lid Part".
Patent Abstracts of Japan, Publication No. 09001530, Publ. Date Jan. 7, 1997, "Forming Method for Break Line".

*Primary Examiner*—Mathieu D. Vargot
*Attorney, Agent, or Firm*—McAulay Nissen Goldberg Kiel & Hand, LLP

[57] ABSTRACT

A method is described for producing a line-shaped weakening in a flat material by one-sided local removal of the flat material by controllable pulsed laser radiation. The occurring line-shaped weakening is not visible on the surface of the flat material that is not machined and has a reproducible constant breaking resistance.

4 Claims, 1 Drawing Sheet

METHOD FOR PRODUCING A LINE-SHAPED WEAKENING BY MEANS OF LASERS

BACKGROUND OF THE INVENTION a. Field of the Invention

The invention is directed to a method for producing a line-shaped weakening in a flat material by local removal of material on one side of the flat material by means of controllable pulsed laser radiation. The flat material can be planar or three-dimensional.

b. Description of the Related Art

It is conventional for many applications to produce a line-shaped weakening of material in order to create a predetermined breaking line which can be broken, in case of need, by the application of force in order to separate the adjoining parts of material from one another or to form an opening. It is always advantageous when such predetermined breaking lines have a constant resistance to breaking along their length so that a severing can be effected with constant force. For various applications it is even required for technical reasons concerning safety that the breaking resistance be producible in a constant and reproducible manner. One such application, for example, is an airbag cover. For cosmetic reasons, it is also sometimes demanded that the predetermined breaking line be invisible to the naked eye of the vehicle passengers.

If the advantages of laser machining are to be used for producing such line-shaped weakened portions, it becomes difficult to meet the demands for a reproducible, constant breaking resistance. A reproducible, constant breaking resistance essentially requires that the residual wall thickness in the area of the line-shaped weakening be producible in a constant and reproducible manner. This can be achieved by uniform removal depth, provided the material has a constant thickness.

But even with homogeneous materials of constant thickness, it is unlikely that a defined residual wall thickness can be achieved by an uncontrolled machining laser. Fluctuations in radiation quality and radiation output lead to corresponding fluctuations in machining depth. A controlling of the laser as a function of the removal depth is required, which presupposes the sensing of the removal depth. The use of mechanical measuring means and, thus, a contacting sensing of the removal depth is ruled out by reason of the small cut gap widths. Nor can electrical or magnetic measurement processes be applied when machining electrically nonconducting materials.

A method for material removal, especially of metal workpieces, with laser radiation is described in DE 39 43 523 C2. According to the invention, the effective laser radiation intensity is regulated by switching the laser on and off depending on the detected heat radiation, which appears unsuitable for higher machining speeds. In order to improve accuracy, the removal depth is measured and taken into account for correcting limiting values. It is mentioned in the description of DE 39 43 527 C2 that the measurement of the removal depth is effected, for example, with an optical sensor working on the principle of triangulation. However, the applicability of this measurement principle is limited to cuts of vertical configuration, cut gap widths greater than the cross section of the measurement beam, and a linear cutting path. Moreover, like other measurement principles which detect removal depth, this measurement principle is not suited to indicate the remaining residual wall thickness if the material thickness is not constant.

The influence of a material thickness which is not constant on the breaking resistance of the predetermined breaking line can only be ruled out by a removal which is regulated depending on the detected residual wall thickness. A solution according to DE 43 20 341 A1 is apparently offered in this connection. A method is disclosed for removal of cover layers of glass building components by laser radiation in which the removal process is regulated in dependence on transmittance values. In this case, the aim is to remove the cover layer of a glass building component in a purposeful and defined manner such that a residual cover layer with a predetermined layer thickness distribution remains behind on the glass building component. The layer thickness remaining on the glass building component can be indicated by way of measuring the transmittance at the machining location. Accordingly, this measuring method is especially suited for removal of uneven layer thicknesses to a given residual layer thickness without the need to determine the topology of the uneven cover thickness beforehand.

In order to determine the residual layer thickness, the intensity of a transmitted measurement beam is measured at the machining location after every machining laser pulse and the measured value is fed to a process computer. By combining individual measurement values, various evaluation criteria can be determined, such as removal efficiency and relative transmission. The measurement value is compared, as an individual value, with a threshold value and when this threshold is exceeded serves as a switch-off criterion for terminating the removal process.

As has been shown in practical tests, the solution according to DE 43 20 341 cannot be successfully applied for producing a line-shaped weakening of desired quality. In contrast to the described removal of cover layers on glass building components where the removal is effected in a planar manner so that occurring combustion residue and evaporation gases are immediately distributed and evaporated or volatilized in a planar manner, these occurring gases and residues remain concentrated at the removal site for longer periods of time when removal is effected in a line-shaped manner, especially when the removal width is substantially smaller than the removal depth, and falsify the transmittance values due to their absorption.

Figure 1:
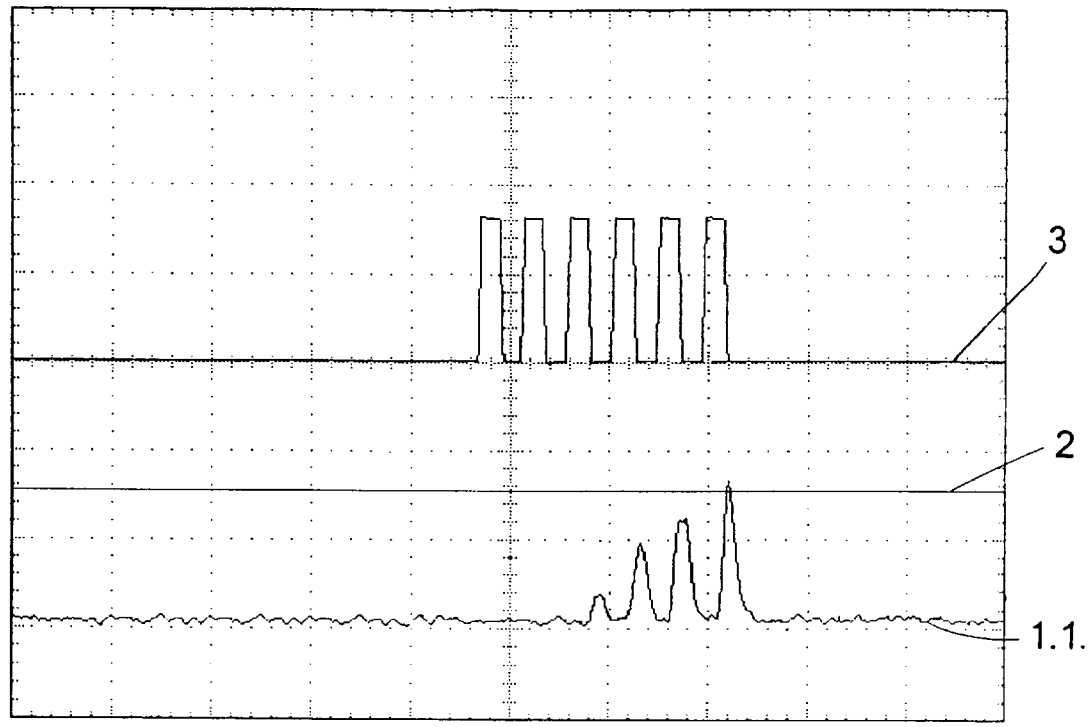
FIG. 1 and FIG. 2 show two measurement value graphs as an aid to understanding.
Figure 2:
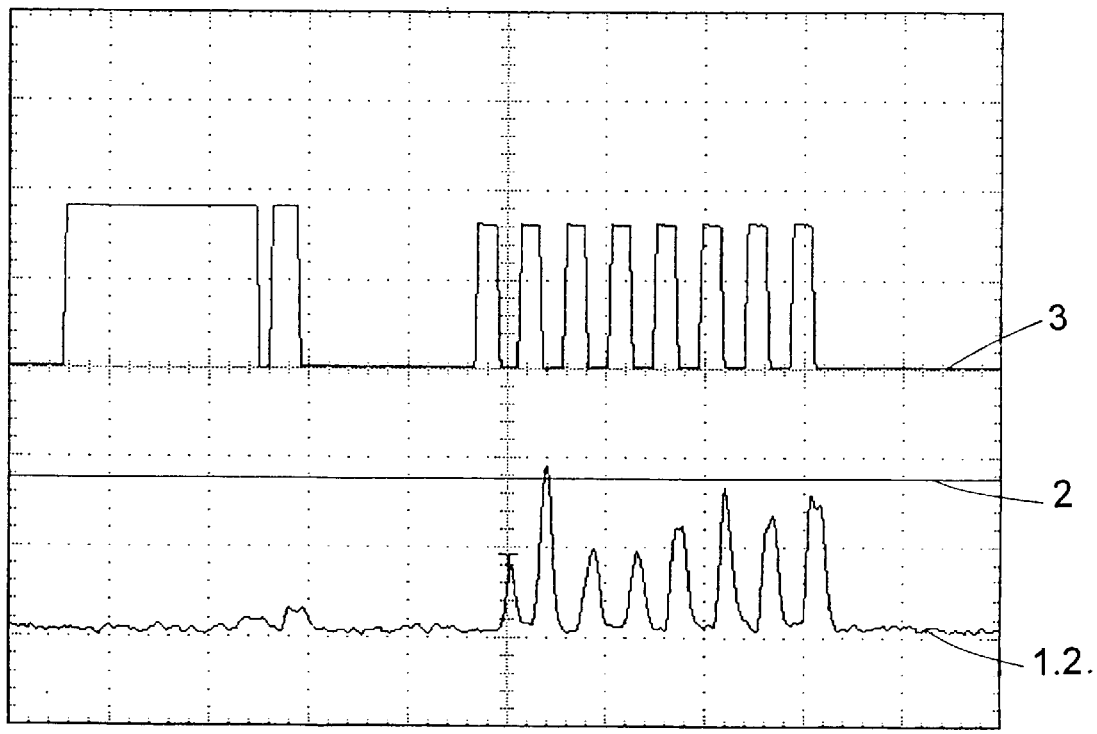

The detector signal curve 1.1 plotted in FIG. 1 corresponds approximately to the theoretical signal curve and results, e.g., in the removal process at a homogeneous material in which the removal width is very large in proportion to the removal depth and the removal rate is slow. After the noise level is exceeded, the level of the detector signal 1.1 rises continuously. In contrast, the rise of the detector signal curve 1.2 as it occurs in the case of line-shaped removal of inhomogeneous material is unsteady, i.e., the rise is substantially discontinuous, and detected following signals even sometimes have a lower level than their precursor signal. The fact that the rise of the detector signal curve 1.2 is not continuous can be explained in part by the inhomogeneous material characteristics of the machined flat material, which leads to different removal depths, given the radiation parameters remain the same. The partially negative rise or zero rise of the signal curve can not be explained in this way.

The cause of this phenomenon substantially resides in the above-mentioned development and thickening of occurring combustion residues and evaporation gases at the immediate machining site. These combustion residues and evaporation gases absorb the laser radiation increasingly as they thicken, so that the signal level does not correlate with the removal depth. The threshold value 2 is exceeded abruptly, often only after an unwanted penetration through the material at the machining site. Multiple repetition of the machining leads to different signal curves in spite of identical process parameters and side constraints. The reason for this is presumably the temporally and spatially inhomogeneous distribution of the combustion residues and evaporation gases in the developing material recesses; this is confirmed by the fact that the deviations of the detector signal curve from the detector signal curve 1.1 increase as the machining speed increases. A switching off of the laser (interruption of control signal 3) when the threshold value 2 is exceeded by the signal level leads to a predetermined breaking line with a sharply fluctuating removal depth.

For the reasons stated above, this method is not suitable for producing a predetermined breaking line that is invisible to the naked eye and has constant residual wall thickness and accordingly constant and reproducible breaking resistance.

OBJECT AND SUMMARY OF THE INVENTION

The primary object of the present invention is to develop a method by which a line-shaped weakening of reproducible and constant breaking resistance which is invisible to the naked eye can be produced in a flat material by means of controllable pulsed laser radiation. The method can also be successfully applied when this flat material comprises a plurality of even inhomogeneous layers and does not have a constant thickness.

This object is met in a method for producing a line-shaped weakening in a flat material in accordance with the invention by local removal of material on one side of the flat material by controllable pulsed laser radiation, wherein a relative movement is effected between the laser beam and the flat material in the direction of the line-shaped weakening to be produced. The method comprises the steps of removing flat material in the form of blind holes which are arranged in series adjacent to one another in the shape of a line and are separated from one another in each instance by a web, detecting a laser beam transmitting through the bottom of the respective blind hole after each laser pulse, forming of an integral value by way of the detector signals obtained during production of a bore hole after every detection, comparing the integral value with a reference value which is predetermined for every blind hole and correlates with desired residual wall strength, switching off the laser radiation when the reference value is reached and switching on the laser beam after completion of relative movement over a predetermined distance which determines the desired web width between two adjacent blind holes. The steps are repeated until the line-shaped weakening is produced in its entire length.

DESCRIPTION OF THE PREFERRED EMBODIMENTS

The invention makes use of the basic ideas known from the prior art to control the removal until a determined flat material thickness is reached by sensing a beam that is transmitted through this flat material. However, it is only by means of the inventive step of forming an integral value by way of the detected transmission radiation that a value is obtained which correlates well with the remaining residual wall thickness in spite of the indefinite influence exerted on the transmission radiation by irregularities in the material and the formation of combustion residues and evaporation gases. However, this presupposes that the line-shaped weakening is not a cut gap, but, rather, is formed of a series of adjacent blind holes. The blind holes create spatially defined spaces in which the occurring gases remain almost complete at least for the short duration of machining. The effect of the absorbent gases on the radiation is accordingly the same when producing individual blind holes. Further, it is ensured by the hole-type removal that the detected radiation is exclusively a transmission radiation through the bottom of the blind hole just machined. Therefore, at least approximately identical residual wall thickness can be concluded from identical integral values.

The better the signal-to-noise ratio and accordingly the more signals are detected and used for forming integral values, the greater the precision with which the laser radiation is switched off when a desired residual wall thickness is reached. Irregularities in the material are also relativized in that the laser is controlled as a function of an integral value, so that the method proves particularly advantageous for machining inhomogeneous materials.

With respect to the two requirements of constant breaking resistance and invisibility, the production of a line-shaped weakening by removal of the flat material in the form of blind holes has additional advantages:

- Whereas when a line-shaped weakening is created by means of cutting or notching, only the residual wall thickness in the cut gap can be varied as a geometric quantity for achieving a determined breaking resistance, the web width between the blind holes can also be varied when arranging a row of adjacent blind holes (hereinafter referred to as perforation line).

- When material is removed in the form of a cut line, the residual material must be strong enough that it does not become inserted in the cut gap and thus become visible. This insertion is prevented in the case of the perforation line by the webs acting as supports, even with far smaller residual wall thicknesses.

- A breaking resistance which is constant over the entire perforation line can also be achieved when the blind holes have different residual wall thicknesses which repeat periodically.

Especially when a line-shaped weakening is to be produced in a multiple-layer composite material, different structures of line-shaped weakening, i.e., different sequences of residual wall thicknesses, can turn out to be more or less advantageous depending on the strength of the individual layers. Thus, in multiple-layer materials in which the individual material layers have a high strength, the line-shaped weakening can be produced in a structure in which all of the blind holes have the same minimum residual wall thickness. The smaller the residual wall thickness, the lower the breaking resistance of the flat material, assuming the material constants of the layers and the web widths remain unchanged. However, low residual wall thickness and narrow web widths result in high thermal loading which, like relaxations of material due to ageing, can lead to an insertion of the residual material in the blind holes so that the line-shaped weakening also becomes visible from the side of the flat material which is not machined. This occurs especially when individual material layers, especially the layers located below the surface layer, are so soft that the remaining webs can no longer fulfil their supporting function. In order to prevent this, a removal of material is effected with periodic changes in depth, so that an appreciably greater web width is maintained in the soft material and the surface layer is not thermally loaded to such a great extent. The resistance to tearing of the line-shaped weakening is not significantly increased thereby, but the risk of visibility of the line-shaped weakening is avoided.

The method according to the invention is particularly advantageous when the line-shaped weakening is arranged in a composite material whose surface layer is three-dimensionally structured. The tearing resistance of the line-shaped weakening is homogeneous in spite of fluctuating material strength of the surface layer due to its texturing or structuring, since, in accordance with the invention, removal was effected to a defined residual wall thickness. It is advantageous in relation to a flat material with a planar unstructured surface that a settling of the residual material into the blind holes can be perceived by the human eye only poorly. Settling and even punctures are harder to perceive when the line-shaped weakening does not extend continuously. Line-shaped weakened portions which are intended to be invisible to the naked eye are not generally provided so as to be broken in the line direction by deliberate application of force, but rather, as a result of a force acting along the surface, the flat material breaks along the line-shaped weakening and accordingly creates an opening in the flat material. It is customary to produce the line-shaped weakening so as to be identical to the circumferential line of the desired opening. However, in order to reduce the likelihood of visibility, it is advantageous for the line-shaped weakening to extend around this circumferential line in an alternating manner. For this purpose, the line-shaped weakening can alternate stochastically about the circumferential line or can also follow a determined function in the case of a similar surface structure. Given a correspondingly coarse surface structure and a line-shaped weakening path adapted to this surface structure, the blind holes of the line-shaped weakening can even be produced with zero residual wall thickness without being perceivable by the naked eye insofar as the punctures are small enough, which is easily accomplished by laser.

In principle, the method according to the invention can be applied to all flat materials which can be machined by laser insofar as at least the surface layer is transparent for at least a laser wavelength. This is advantageously the wavelength of the machining laser. It is essentially also realizable, although with a higher expenditure on technology, for the machining site to be acted upon additionally by a measurement beam whose transmitting component is detected. Surface layers of plastics as well as leather, vulcanized and unvulcanized rubber, industrial textiles and paper type flat materials can be advantageously machined. Instead of the foamed material layer and the molded wood layer of the first embodiment example, the surface layer can be applied to various single- or multiple-layer flat materials such as plastics composite materials and plastic laminates as well as wood, vulcanized or unvulcanized rubber, and cardboard.

In a first embodiment example, the flat material is a composite material comprising three different inhomogeneous material layers, a fixed carrier layer of molded wood material which imparts stability to the composite material, a soft foamed layer and a thin TPO [thermoplastic polyolefin—Trans.] sheet as surface layer. In order to achieve the desired breaking resistance, a line-shaped weakening structure is selected with alternating sequences of two blind holes with residual wall thickness a and two blind holes with residual wall thickness b at constant web width c. The residual wall thickness a, smaller than the thickness of the TPO sheet, was determined as a function of the material parameters of the TPO sheet in such a way that the sheet is partially removed, but the residual material is sufficiently strong to remain dimensionally stable even over a long period of time. The residual wall thickness b, greater than the thickness of the TPO sheet, was so determined that the carrier layer is completely penetrated, while a slight removal of material at most is effected in the foamed layer. Accordingly, the foam continues to support the sheet over large web widths, while the carrier layer is continuously weakened. The foam layer and the TPO sheet have a transmittance for the wavelength of the machining laser of appreciably greater than zero.

In order to carry out the method according to the invention, a laser beam with controllable pulsed output and controllable pulse train is directed to the composite material on the carrier layer side. A sensor detecting the component of the laser beam transmitting through the composite material is arranged below the composite material on the TPO sheet side so as to be aligned in the direction of the laser beam. The parameters of the detector and of the laser beam source are so adapted to one another that a first signal is detected when the carrier layer at the machining site is completely removed. A relative movement is effected between the laser beam and the composite material in the direction of the line-shaped weakening to be produced. This relative movement can be either a continuous movement with a speed of negligibly small magnitude relative to the pulse frequency, smaller than the maximum removal rate, or the movement is constantly interrupted during the machining of the composite material by the laser radiation.

The machining of the composite material starts with a pulse regime for high pulse outputs, which enables a rapid penetration of the carrier layer. The pulse regime is changed when a first signal is detected in order to adapt it to the removal response of the foamed material layer. In particular, the selected pulse duration is smaller, which results in reduced thermal loading and a retardation of the material removal. The slower the removal is effected, the more signals are detected. After each signal reception, an integral is formed by means of the signals already detected and the integral value is compared with a comparator value. As soon as the integral value reaches the comparator value which was determined in previous tests as a correlation value to the residual wall thickness a, the laser radiation is switched off. The second hole is produced at a web distance c from the first hole in an analogous manner. During the production of the third and fourth holes, the laser radiation is already switched off when the formed integral value reaches the comparator valve b. Since its integral value is already achieved after one signal or only a few signals are detected, the accuracy of the remaining residual wall thickness is also low. However, this is not disadvantageous since a slight penetration into the foamed material at a different depth has no influence on the breaking resistance of the line-shaped weakening as a whole.

While the foregoing description and drawings represent the preferred embodiments of the present invention, it will be obvious to those skilled in the art that various changes and modifications may be made therein without departing from the true spirit and scope of the present invention.

What is claimed is:

1. A method for producing a line-shaped weakening in a flat material by local removal on one side of the flat material by controllable pulsed laser radiation, wherein a relative movement is effected between the laser beam and the flat material in the direction of the line-shaped weakening to be produced, comprising the following steps:

removing flat material in the form of blind holes which are arranged in series adjacent to one another in the shape of a line and are separated from one another in each instance by a web;

detecting a laser beam transmitted through the bottom of the respective blind hole during each laser pulse;

producing detected signals as a result of detecting said transmitted laser beam, forming of an integral value of said detected signals obtained during production of a blind hold after every detection;

comparing the integral value with a reference value which is predetermined for every blind hole and correlates with desired residual wall strength;

switching off the laser radiation when the reference value is reached;

switching on the laser beam after completion of relative movement over a predetermined distance which determines the desired web width between two adjacent blind holes; and repeating the method steps until the line-shaped weakening is produced in its entire length.

2. The method for producing a line-shaped weakening according to claim 1, wherein the detected laser beam is a portion of the radiation which effects the removal of material.

3. The method for producing a line-shaped weakening according to claim 1, wherein the detected laser beam is part of a measurement beam which is additionally directed to the blind hole that has just been machined.

4. The method for producing a line-shaped weakening according to claim 1, wherein the reference values given for the individual blind holes form a recurring sequence of different amounts so that different web widths can be produced in different material depths.

* * * * *